United States Patent
Bet et al.

(10) Patent No.: US 7,190,093 B2
(45) Date of Patent: Mar. 13, 2007

(54) MODULAR AUTOMATION DEVICE INCLUDING CONTROL AND POWER UNITS

(75) Inventors: Robert Bet, Velars s/Ouche (FR); Michel Girard, Corcelles-les-Citeaux (FR); Philippe Rix, Dijon (FR)

(73) Assignee: Schneider Automation Inc., North Andover, MA (US)

( * ) Notice: Subject to any disclaimer, the term of this patent is extended or adjusted under 35 U.S.C. 154(b) by 464 days.

(21) Appl. No.: 10/412,236

(22) Filed: Apr. 14, 2003

(65) Prior Publication Data

US 2003/0193784 A1 Oct. 16, 2003

(30) Foreign Application Priority Data

Apr. 15, 2002 (FR) .................................. 02 04833

(51) Int. Cl.
    *H01B 7/30* (2006.01)
(52) U.S. Cl. ...................................... 307/147; 361/729
(58) Field of Classification Search .................. 307/11, 307/66, 147; 361/729, 728
See application file for complete search history.

(56) References Cited

U.S. PATENT DOCUMENTS

| | | | | |
|---|---|---|---|---|
| 5,117,122 A | * | 5/1992 | Hogarth et al. ............. | 307/140 |
| 5,936,389 A | * | 8/1999 | Miyagawa et al. ......... | 323/282 |
| 6,123,585 A | * | 9/2000 | Hussong et al. ............ | 439/652 |
| 6,351,083 B1 | * | 2/2002 | Ten Holter ................ | 315/315 |
| 6,937,461 B1 | * | 8/2005 | Donahue, IV .............. | 361/622 |
| 7,024,261 B1 | * | 4/2006 | Tanton ........................ | 700/96 |
| 2001/0036063 A1 | * | 11/2001 | Nagaya et al. .............. | 361/729 |
| 2001/0053619 A1 | * | 12/2001 | Imoto .......................... | 439/55 |
| 2002/0048161 A1 | * | 4/2002 | Malkowski et al. ........ | 361/826 |
| 2003/0117025 A1 | * | 6/2003 | Rouquette ................... | 307/147 |
| 2004/0080903 A1 | * | 4/2004 | Byrne ........................ | 361/683 |
| 2004/0149446 A1 | * | 8/2004 | Appleford et al. .......... | 166/366 |

FOREIGN PATENT DOCUMENTS

| | | |
|---|---|---|
| DE | 42 23 193 | 1/1994 |
| FR | 2 567 304 | 1/1986 |

\* cited by examiner

*Primary Examiner*—Chau N. Nguyen
*Assistant Examiner*—Daniel Cavallari
(74) *Attorney, Agent, or Firm*—Oblon, Spivak, McClelland, Maier & Neustadt, P.C.

(57) ABSTRACT

An automation device includes a modular assembly with a primary group configured for use with a hardware element. The primary group includes a controller providing signals. A feeder unit provides power to automated units. A primary first link connects the input/output modules, the primary first link carrying the signals and carrying power to the input/output modules. A primary second link connects the input/output modules and carries power to the automated units. A terminating module connects to the primary first and second links. A secondary module group is associated with a secondary zone of the hardware element. The secondary group includes a lead module connected to a secondary first link and a secondary second link, the secondary first link connected to the primary first link. A cable connects the terminating module with the lead module.

7 Claims, 4 Drawing Sheets

MODULAR AUTOMATION DEVICE INCLUDING CONTROL AND POWER UNITS

This invention concerns a modular automation device associated with a hardware element comprising several automated units. Such a device consists of a primary group of modules located on a common frame, including a control unit, such as a bus coupler; a feeder unit capable of supplying at minimum the electrical power supply for the automated units of the hardware element; and several functional input and/or output modules to which the automated units are attached.

The bus coupler is used to carry command/control signals between an external bus, in particular a field bus, and a command and/or surveillance system such a programmable robot. The automation device, on the other hand, supplies low-voltage power to the electronic circuits of the various modules, typically at 5V or 24V DC. It must also at minimum supply electrical power for the automated application units, such as sensors and actuators. Voltages, described henceforth as "application voltages", are typically 24V or 48V DC (direct current) or 110V or 250V AC (alternating current). The functional input-output modules transmit signals and application voltages to the sensors and actuators.

These modules are connected by a "signal link", to carry control signals and, at minimum, power to operate the modules, and a "feeder link", carrying power at the application voltages, required to operate the application units. These links comprise internal buses located either on the floor of the unit or on a base plate; or connected laterally, using individual adaptors.

Such devices are well known, in particular from documents EP 661 915, EP 677 986 and EP 1 022 809. Their modular layout allows their functionality to be extended easily by adding modules. Sometimes, however, for an automated installation or for a machine, it can prove necessary to identify a number of zones, differentiated for example by their function or their relative spacing, by allocating a group of primary modules to a primary zone and at least one secondary group of modules to a secondary zone. However, ever, this means providing a bus coupler for each secondary group, which is expensive.

The particular purpose of the invention is to adapt an automation device of the type described, so as to avoid the need for a bus coupler for a secondary group of modules linked to a primary group.

The invention considers a device with at least one secondary group of modules in the hardware element's secondary zone. The group has both a lead module, and first and second links extending those of the primary group,
a linking cable, associated with the first link and capable of carrying control-command signals and power at the right voltage for the modules, is connected to the terminating module in the primary group and to the lead module in the secondary group. This secondary-group lead module is constructed to carry shielded control-command signals to or from the secondary group(s) and to transmit power to modules in the secondary group.

The primary group of modules ideally includes at least one feeder unit to power the electronic circuits of modules further down, by acting as a voltage converter capable of providing a low-voltage supply at its nominal level on the first link from a high-voltage supply from the same connection. The lead module for the secondary group may have similar means to convert voltages.

A feeder unit, connected to an external voltage source and capable at minimum of providing the electrical power supply for the automated units, may also be used adjacent to the secondary group's lead module.

By using at least one separate feeder conductor in the linking cable, the terminating module in the primary group can be used to apply voltages for the second bus link to the automated units not handled by the first bus link. To achieve this, the terminating module can be used both as a terminal block for connecting conductors to feed the application units and, using a movable flap, to separate the linking cable from the power supply conductors.

One possible way of using the invention is described below, referenced to the attached drawings.

Figure 1:
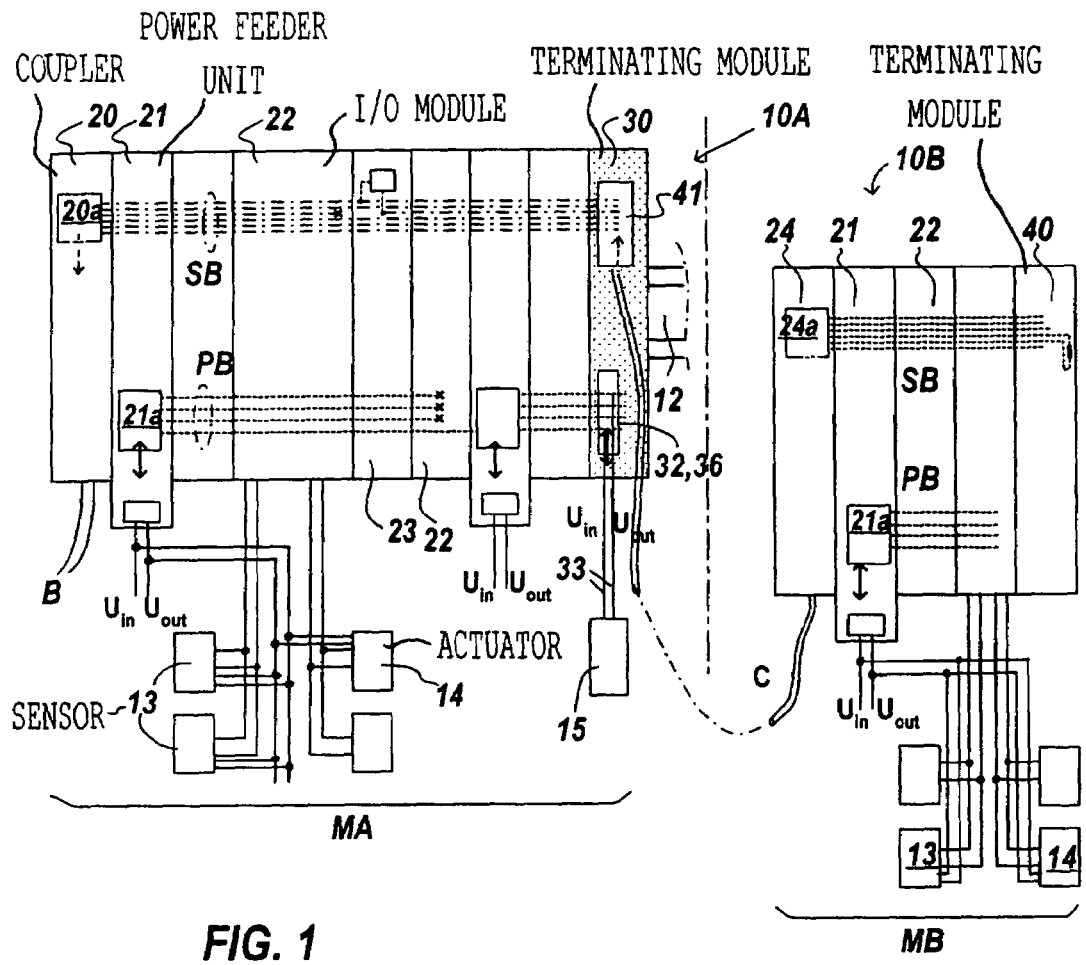
FIG. 1 shows a diagram of the front view of the type of automation device that uses the invention.

The device illustrated in the figures includes a primary group 10A of electronic modules intended to fit together (FIG. 1). They are clipped into individual fittings 11 (see FIG. 4), which themselves are fixed side-by-side to a frame in any usual way, for example using a standard mounting rail 12. The group of modules 10A is associated with zone MA of a hardware element, for example, a machine or part of a machine, and regulates the data flow to or from the hardware element, as shown in FIG. 1. In addition, the power supply for the automated units-sensors 13 or actuators 14-passes via the group of modules 10A associated with the MA zone.

For this to work, the group of modules includes a link SB to carry signals and power to supply the module circuits, and a link PB to carry power to the automated units at the voltages the hardware element requires. The adaptors 11 are interconnected sideways by the co-operating contacts SBC and PBC in such a way that the continuity of the links is ensured. The links SB, PB are sited at different heights, but at the same depth (see FIG. 4).

The group 10A includes firstly a control unit, here a coupler 20 to which is attached an external field bus B—for example, a CANOpen, DeviceNet, Ethernet, FipI/O, Modbus, Profibus or other—linked to a programmable robot or other control/command unit. Alternatively, the control unit may be a CPU.

The group 10A also includes at minimum a feeder module 21 capable of supplying sensors 13 and actuators 14 with the feeder voltages they require from the external voltages $U_{in}$ and/or $U_{out}$, as well as input/output modules 22 of various sizes connected to units 13,14 and a terminating module 30. The modules 22 have printed circuits and appropriate connectors and module 23 is provided to guarantee the feeder voltage levels for these electronic circuits. Should an excessive voltage drop occur for one of the voltages in the SB link, this module returns the voltage to its nominal level from the highest voltage in the link SB.

Figure 2:
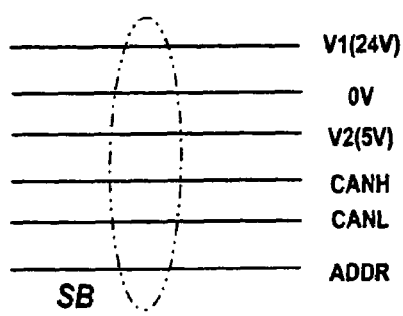
FIG. 2 shows detail of the signal link between the modules of the device.

FIG. 2 shows an example of the composition of the low-voltage SB link: a "high" voltage line V1 (24V), a 0V line, a "low" voltage line V2 (5V), and signal lines depending on the type of bus used. Here, the internal bus type is CAN, so there are CANH and CANL lines, and an addressing line ADDR. The coupler 20 includes 20a, for interfacing and linking. This couples the lines in the SB link to those in the bus B.

Returning to FIG. 2, power feeder unit 21 includes the means 21a to connect and convert external voltage sources $U_{in}$ (sensor voltage), $U_{out}$ (actuator voltage) to the voltages expected on the PB link: for example, 24 or 48V DC for sensors and 24V DC, 48V DC, 110 V AC or 250V AC for actuators. The available voltages $U_{in}$, $U_{out}$ are safety voltages or not safety voltages, depending on the particular hardware element. The feeder unit 21 ensures the group of modules is earthed.

Figure 3:
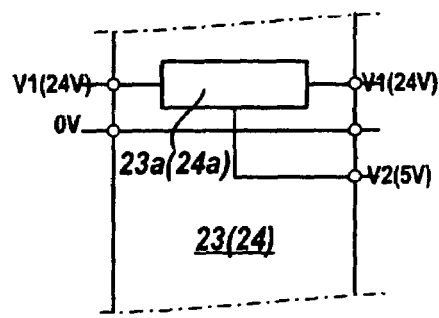
FIG. 3 shows detail of the voltage conversion for the signal link.

The voltage V1 is less affected by the length of the transmission path than the voltage V2. It is therefore better to use the voltage V1 (24V) to produce the voltage V2 (5V). Thus, as shown in FIG. 3, module 23 has a conversion circuit 23a that converts the voltage 24V DC to a voltage of 5V DC to ensure that the modules 22 sited down from module 23 will be suitably supplied with 5V.

Figure 4:
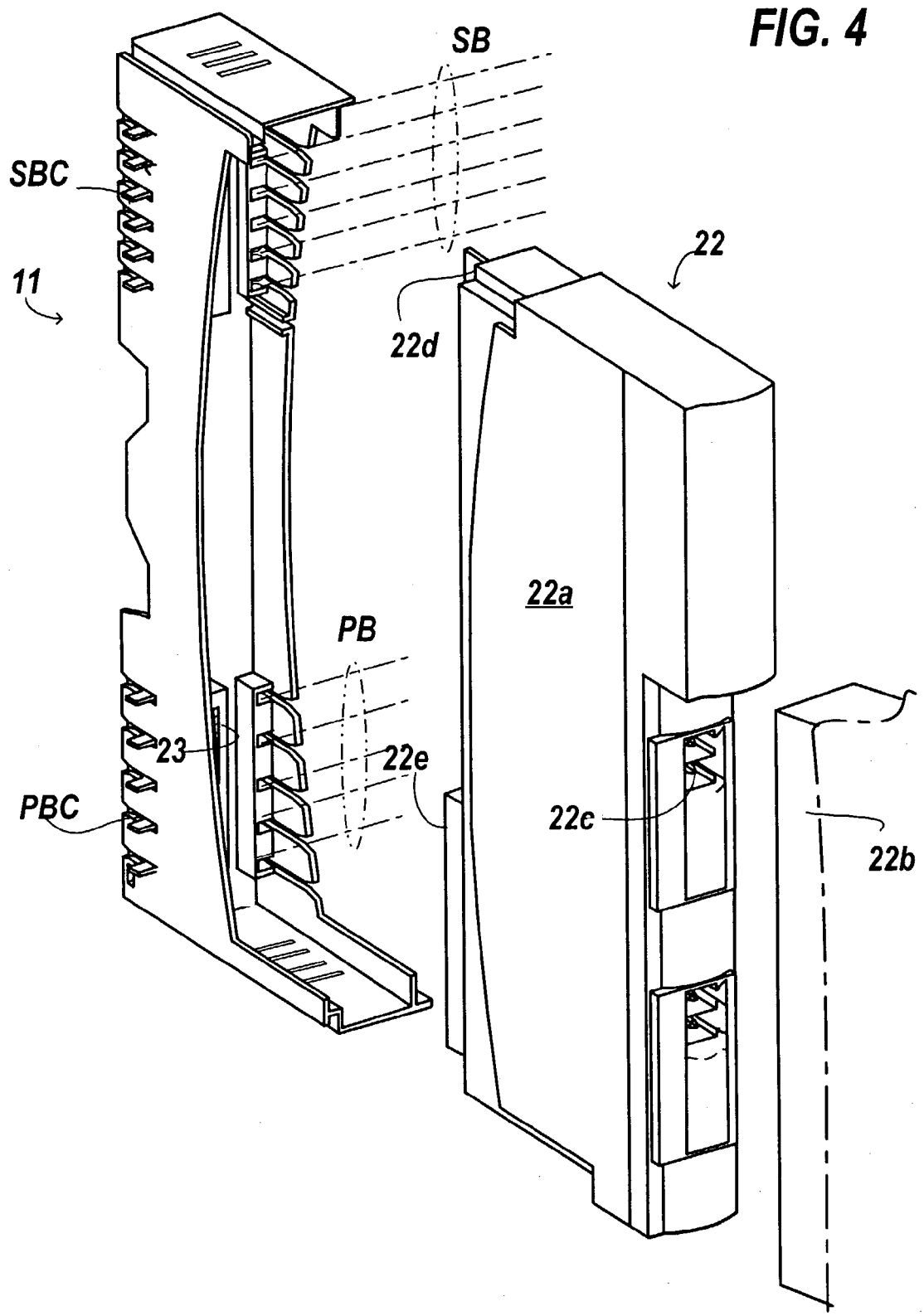
FIG. 4 is a perspective view of an input-output module for the device.

As shown in FIG. 4, an input/output module 22 comprises a casing 22a clipped detachably to a set of adaptors 11. A terminal block 22b with an external connection to the automated units 13, 14 for surveillance or issuing commands can be fitted in front of the casing 22a. The connections 22c are provided at the front of the casing to take the corresponding connections in the terminal block 22b. The individual connectors or contacts 22d, 22e are at the back of the casing for slotting into the corresponding contacts to connect respectively to the low-voltage SB link and the power link PB. It is useful to note that each module 22 can be removed from the group while operational without affecting either the buses' continuity, or the operation of the modules further down (a "hot swap").

Figure 5:
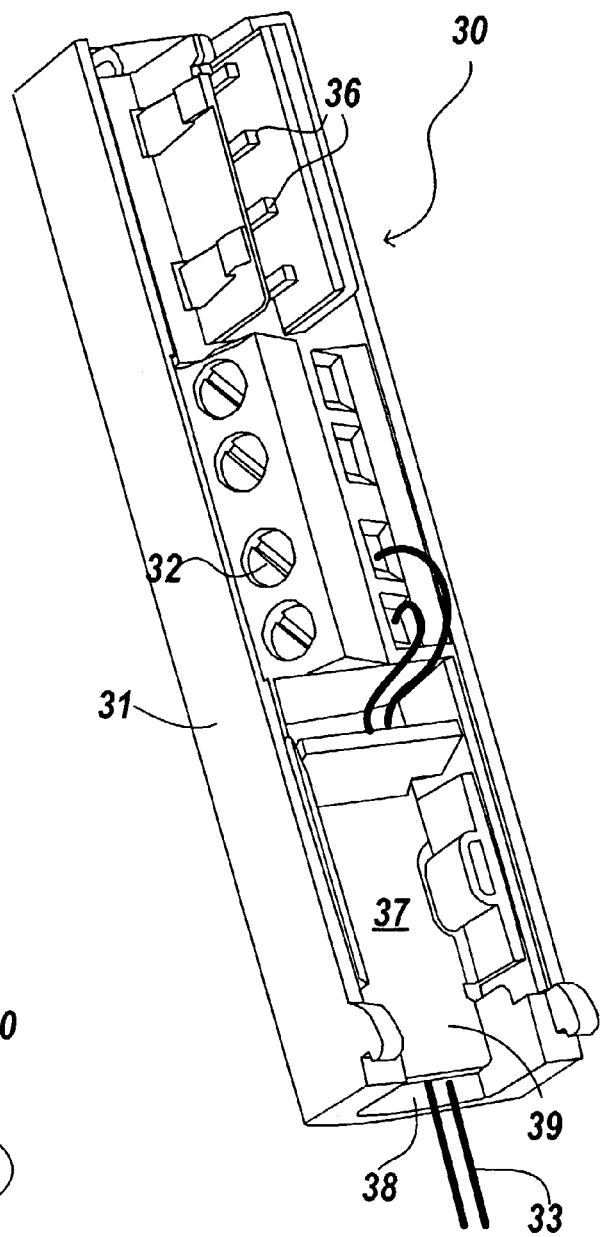
FIG. 5 is a perspective rear view of the terminal block for the device's terminating module.
Figure 6:
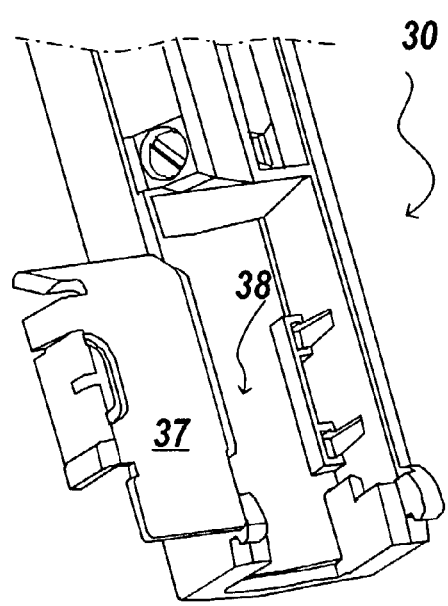
FIG. 6 shows a detail of this module.
Figure 7:
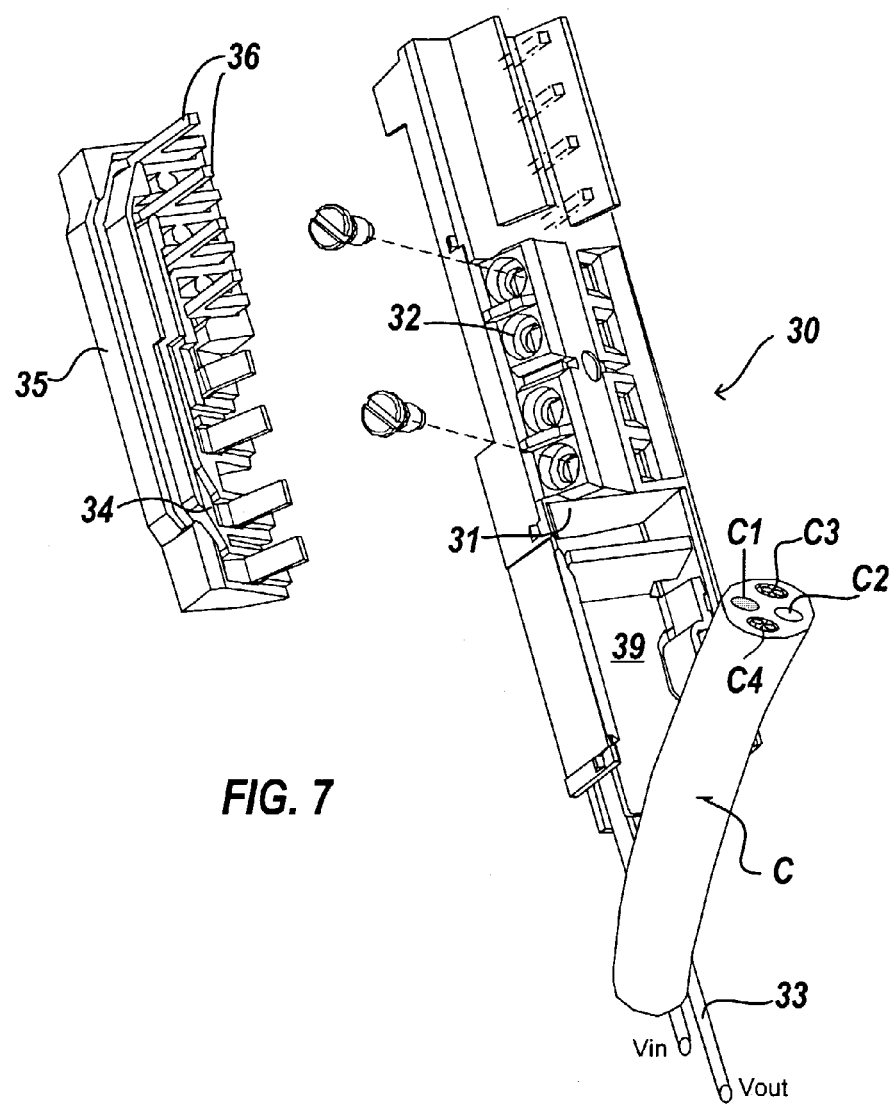
FIG. 7 is an expanded perspective view of the terminal block in FIG. 5.

FIGS. 5 to 7 show in more detail, viewed from behind, a terminal block 31 belonging to a terminating module 30, the term "terminating" meaning situated at the far end (away from the coupler) of the primary group. The terminating module 30 is used to pass signals, and ideally the highest voltage in the SB link, to the lead module 24 of a secondary group of modules (or a group further away) 10B, so this group does not need to include a new coupler 20. The group is associated with another zone MB of the hardware element, or a hardware sub-element, and such a group 10B is represented in FIG. 1. It includes in turn, apart from the lead module 24, a power feeder module 21, input and/or output modules 22 and a terminating module 40 that ensures the proper termination of the bus lines, for example by a resistive loop. As for the modules in the group 10A, those 24, 21, 22 and 40 of the group 10B are mounted on adaptors 11 that ensure the continuity of the links SB and PB. In the absence of a secondary group 10B, a module 40 of the type shown for the group 10B is mounted at the far end of the primary group 10A.

The connecting link SB between the groups 10A and 10B uses a cable C shielded from interference. One end of the cable C is connected to the SB link of the group 10A in the terminating module 30 (connector 41 shown in FIG. 1) and the other end to the SB link belonging to the group 10B in its lead module 24. Cable C is, for example of type IEEE 1394 and, as can be seen in FIG. 7, has a strand C1 at the highest voltage V1 for the SB link, a strand C2 for return voltage 0V, and two independent shielded twisted pairs C3, C4 to carry the bus signals. The lead module 24 includes the means 24a, analogous to 23a in module 23, to convert the "high" voltage V1 (24V), carried by the cable C, to "low" voltage V2 (5V). This means that the SB link in the group 10B has a guaranteed supply of "low" voltage V2.

The terminating module 30 is also used to supply, via the voltages in the PB link, the automated units 15, sensors or actuators, not handled by the SB link. A terminal block 31 with terminals 32 connects the conductors 33 to the units 15. The terminals 32 are themselves linked by the comb of internal conductors 34 mounted on a support 35 to the connecting pins 36 which work with a connector (not shown) on the printed circuit of module 30. The terminal block has a pivotal mounting on the casing of module 30 and its lower part is divided by a pivoting flap 37 which separates an upper conduit 38 (lower in FIGS. 5 to 7) from a lower housing 39 (upper in FIGS. 5 to 7).

In the open position (FIG. 6), the flap 37 allows the conductors 33 connected to the terminals 32 to run through the conduit 38. When it is re-closed (FIGS. 5 and 7), the flap 37 leaves a substantial space for the cable C to pass. It is worth noting that cable C occupies a fairly large space, because of the way it is made, and because of its shielding against interference. The housing shown for the terminating module, with the compartments at the lower end of terminal block 31, means that it is easy to provide a signal link with connector 41 sited at the top of the module, and a power link with the terminals 32 sited at the lower end of the module.

Figure 8:
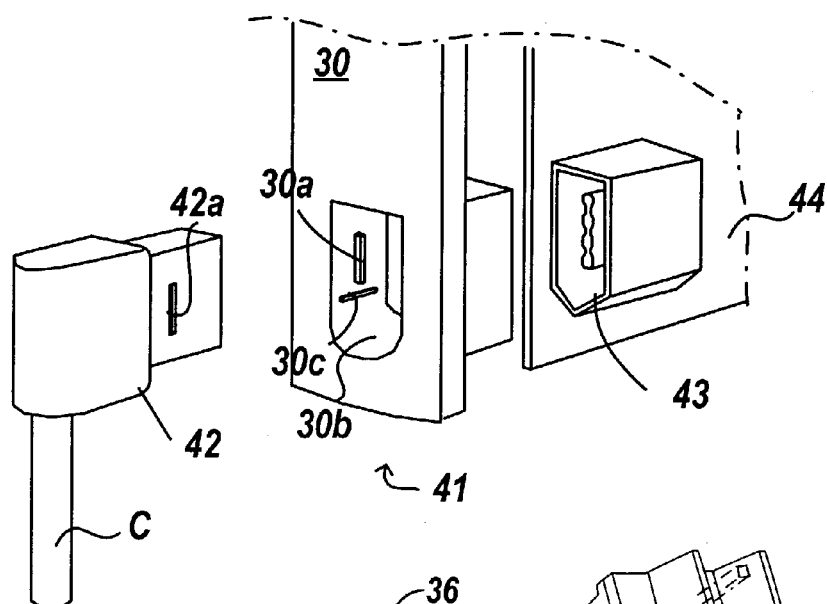
FIG. 8 shows detail of the connection for the linking cable.

As shown in FIG. 8, connector 41 for the linking cable C has a female part 42 moulded 42a to receive the shape 30a provided in a connecting channel 30b in the terminating module 30. In this way, the female part 42 of the connecter can connect to the male part 43 of the connector soldered to an electronic circuit board 44, without the risk of damage to the soldering from vibration between the connector 41 and module 30. Guiders 30c for the female part 42 are also provided in the channel 30b.

The invention claimed is:

1. An automation device comprising a modular assembly configured to be used with a hardware element, the modular assembly comprising:

a primary group of modules located on a common rigid frame associated with a primary zone of the hardware element, the primary group comprising
a control unit configured to provide control signals,
input/output modules connected to the automated units,
a feeder unit configured to provide feeder power to the input/output modules and to the automated units,
a primary first link connecting the feeder unit and the input/output modules, the primary first link configured to carry the control signals and to carry the feeder power to the input/output modules,
a primary second link connecting the feeder unit and the input/output modules and configured to carry the feeder power to the automated units, and
a terminating module connected to the primary first and second links;
at least one secondary group of modules associated with a secondary zone of the hardware element and located on a second rigid frame, the secondary group comprising a lead module connected to a secondary first link and a secondary second link, the secondary first link connected to the primary first link and the secondary second link connected to the primary second link; and
a linking cable connecting the terminating module of the primary group with the lead module, the linking cable comprising a shielded cable configured to carry the control signals and feeder power to the secondary group of modules.

2. The device in claim 1, wherein the primary group of modules comprises a voltage transformer configured to provide a low-voltage power supply on the primary first link from a high-voltage supply on the primary first link.

3. The device in claim 1, wherein the secondary group comprises a secondary feeder module configured to provide power to secondary automated units in the secondary group.

4. The device in claim 1, wherein the terminating module is connected to a feeder conductor separate from the linking cable to provide power to the automated units that are not connected to the primary first link.

5. The device in claim 4, wherein the terminating module comprises a terminal block including terminals to connect to the automated units that are not connected to the primary first link.

6. The device in claim 5, wherein the terminal block comprises a movable flap providing a space to receive the linking cable and a space for conductors connecting to the automated units that are not connected to the primary first link.

7. The device in claim 1, wherein the linking cable is connected to the terminating module by a connector having a female part and a male part connected to a printed circuit board, and the terminating module has a connecting channel configured to receive the female part, the female part and the connecting channel being shaped to avoid transmission of a vibration to the printed circuit board.

* * * * *